(12) United States Patent
Asayama et al.

(10) Patent No.: US 8,004,878 B2
(45) Date of Patent: Aug. 23, 2011

(54) SEMICONDUCTOR DEVICE AND METHOD FOR DESIGNING THE SAME

(75) Inventors: Shinobu Asayama, Kanagawa (JP); Toshio Komuro, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 112 days.

(21) Appl. No.: 12/458,330

(22) Filed: Jul. 8, 2009

(65) Prior Publication Data

US 2010/0073982 A1    Mar. 25, 2010

(30) Foreign Application Priority Data

Sep. 19, 2008   (JP) ................................. 2008-241801

(51) Int. Cl.
*G11C 16/04* (2006.01)
(52) U.S. Cl. ........................................ 365/154; 365/205
(58) Field of Classification Search .................. 365/154, 365/205
See application file for complete search history.

(56) References Cited

U.S. PATENT DOCUMENTS

| 7,142,064 B2 | 11/2006 | Chan et al. |
| 2006/0097802 A1 | 5/2006 | Chan et al. |
| 2008/0094878 A1* | 4/2008 | Joshi et al. ................... 365/154 |

* cited by examiner

*Primary Examiner* — Michael T Tran
(74) *Attorney, Agent, or Firm* — McGinn IP Law Group, PLLC

(57) ABSTRACT

Disclosed herewith is a semiconductor device having an SRAM cell array capable of easily evaluating the performance of transistors and the systematic fluctuation of wiring capacity/resistance. In order to form an inversion circuit required to form a ring oscillator, a test cell is disposed at each of the four corners of the SRAM cell array and the ring oscillator is operated while charging/discharging the subject bit line. Concretely, the ring oscillator is formed on a memory cell array and the ring oscillator includes test cells disposed at least at the four corners of the memory cell array respectively. At this time, a wiring that is equivalent to a bit line is used to connect the test cells to each another.

10 Claims, 14 Drawing Sheets

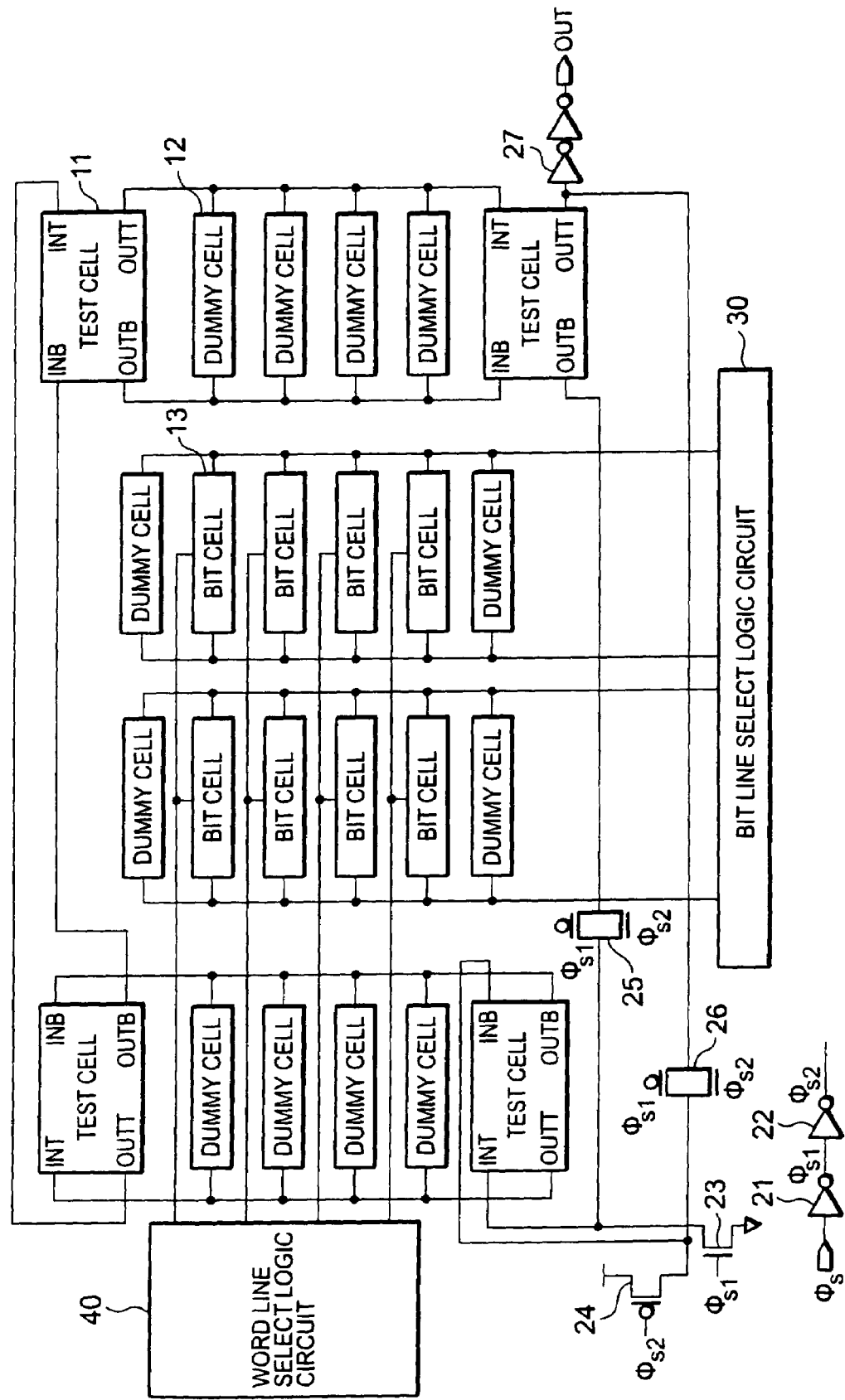

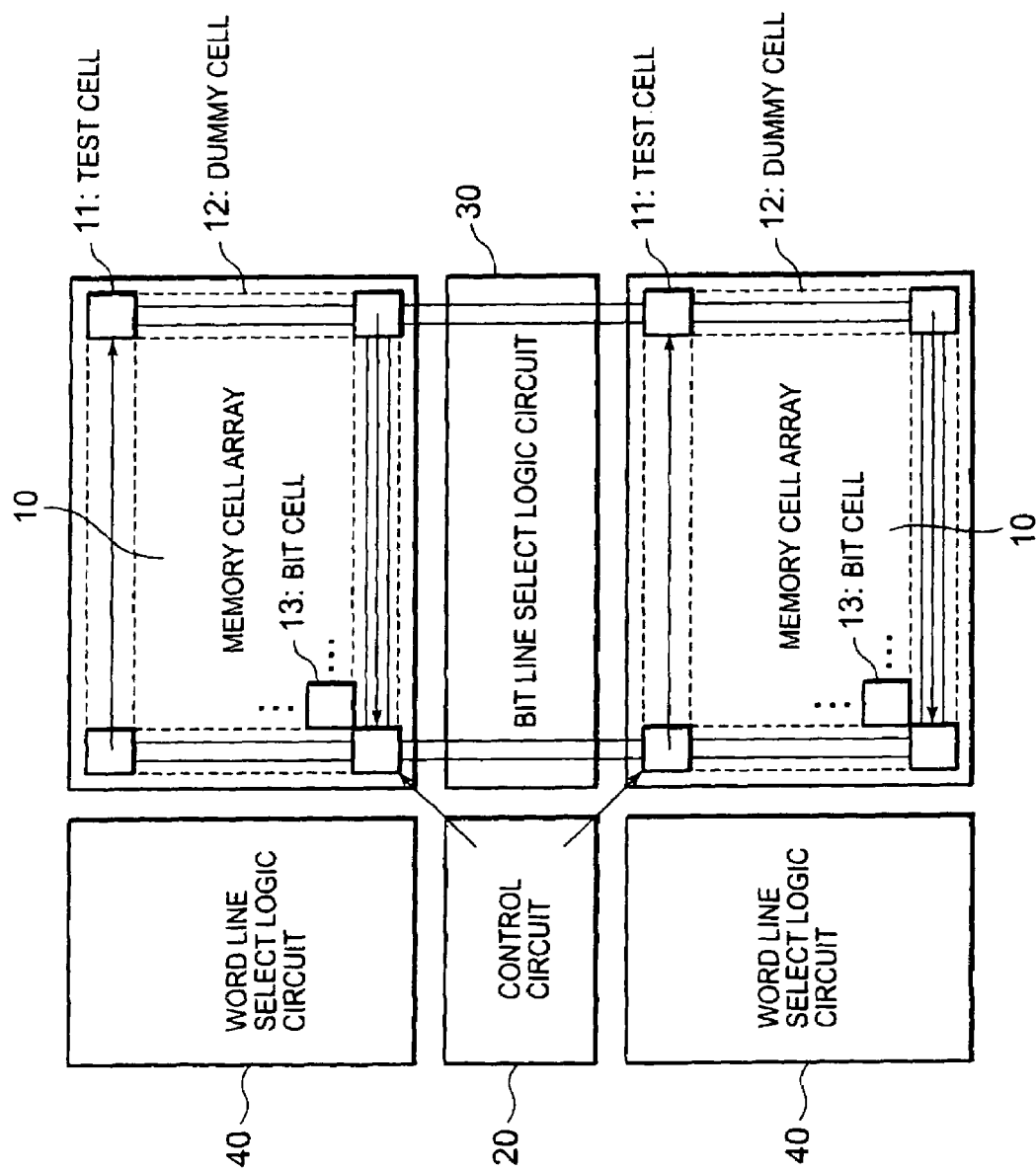

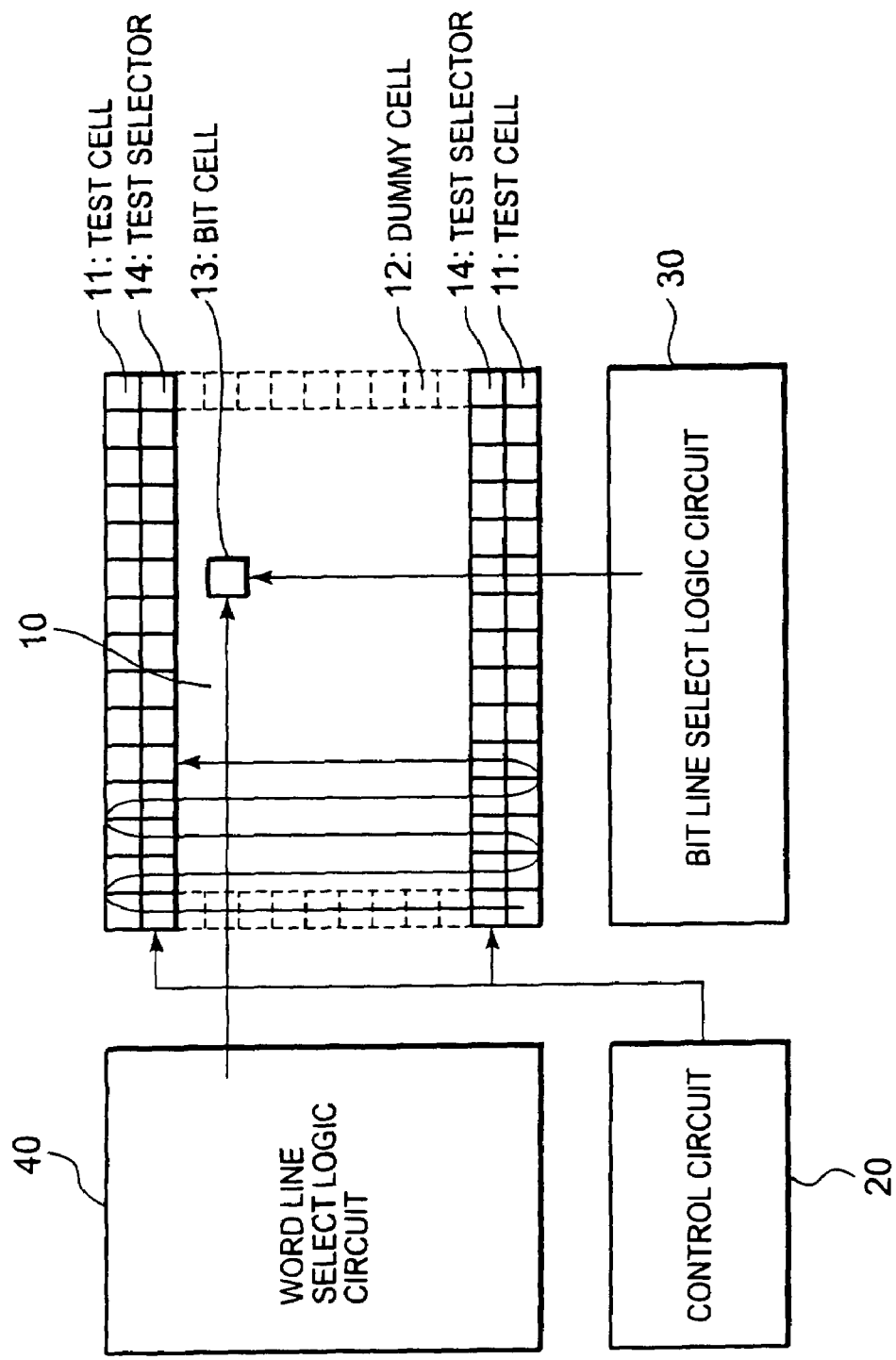

SEMICONDUCTOR DEVICE AND METHOD FOR DESIGNING THE SAME

FIELD OF THE INVENTION

The present invention relates to a semiconductor device, and more particularly to a semiconductor device that uses a ring oscillator.

BACKGROUND OF THE INVENTION

In case of reading data from a cell array of an SRAM (Static Random Access Memory), the reading speed is determined by the cell positioned farthest from the subject sense amplifier in the cell array and this has been a problem. And even in case of writing, a problem has arisen from whether or not single bit information held in the F/F (Flip-Flop circuit) of the cell positioned farthest from the subject write circuit is inverted as soon as the writing is done.

Those problems are caused not only by the characteristics of the transistors of each of the subject SRAM array cells, but also by the parasitic capacity/resistance of the subject bit line. At this time, the capacity/resistance value is affected significantly by the level of the wiring film pressure/inter-layer film pressure employed in a wafer diffusion process.

Techniques related to such ring oscillators composed of conventional SRAM cells respectively are disclosed by U.S. Pat. No. 7,142,064 A and US 2006/0,097,802 A1.

SUMMARY

In order to operate such a ring oscillator, test cells are disposed at each end of the object cell array to form an inverter circuit that functions as the ring oscillator. The oscillator is operated while the subject bit line is charged/discharged.

The semiconductor device of the present invention includes an SRAM cell array and a ring oscillator formed with cells disposed on the SRAM cell array and connected to each another through a bit line wiring formed on the SRAM cell array.

The semiconductor device designing method of the present invention includes a step of forming a ring oscillator with cells provided on an SRAM cell array and a step of connecting the cells used to form the ring oscillator to each another through the bit line wiring provided on the SRAM cell array.

Therefore, the present invention comes to be able to easily evaluate the performance of transistors and the systematic distribution of the wiring capacity/resistance.

BRIEF DESCRIPTION OF THE DRAWINGS

FIG. 5B is a concrete detailed block diagram of the semiconductor device in the configuration employed in the first embodiment of the present invention;

FIG. 9A is a block diagram of a semiconductor device in a configuration employed in a second embodiment of the present invention;

FIG. 10A is a first block diagram of a semiconductor device in a configuration employed in a third embodiment of the present invention;

DETAILED DESCRIPTION OF THE PREFERRED EMBODIMENTS

Hereunder, there will be described the first embodiment of the present invention with reference to the accompanying drawings.

Figure 1:
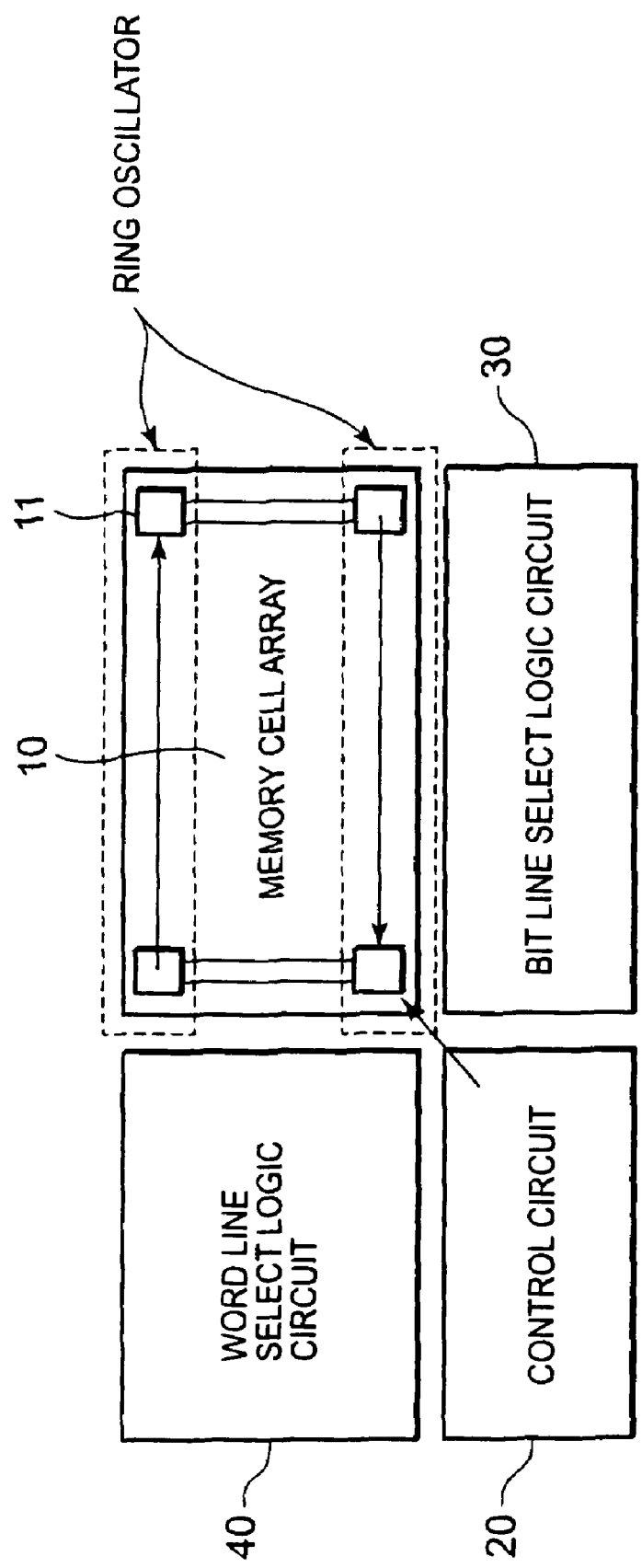
FIG. 1 is a block diagram of a semiconductor device of the present invention in a basic configuration.

As shown in FIG. 1, the semiconductor device of the present invention includes a memory cell array 10, a control circuit 20, a bit line select logic circuit 30, and a word line select logic circuit 40.

In this first embodiment, it is premised that the semiconductor device is an SRAM cell array or a semiconductor integrated circuit that includes such an SRAM cell array. Actually, however, the present invention is not limited only to this example.

The memory cell array 10 is a rectangular-shaped macro-cell. The memory cell array 10 includes a plurality of test cells 11.

Each of the test cells 11 (11-i, i=1 to x: x is a given number) is used to carry out an evaluation test and disposed at each end of the memory cell array to form an inverter circuit of a ring oscillator. In other words, in the semiconductor device of the present invention, the ring oscillator that includes such test cells 11 is provided on the memory cell array 10. Here, each test cell 11 consists of six transistors just like an ordinary SRAM cell. However, how those six transistors are connected to each another in each test cell 11 is different from that of the transistors in the ordinary SRAM cell.

The control circuit 20 drives those test cells 11.

The bit line select logic circuit 30 drives the bit lines provided on the memory cell array 10.

The word line select logic circuit 40 drives the word lines provided on the memory cell array 10.

According to the present invention, a wiring provided for a bit line (bit line wiring) is referred to as a "bit line" even when the wiring is not used actually as a bit line on the memory cell array 10.

Next, there will be described an example of the configuration of the test cell 11 with reference to FIG. 2.

Each test cell 11 includes a first access transistor 111, a second access transistor 112, a first inverter 113, and a second inverter 114.

The first and second access transistors 111 and 112 are combined to form a cross-coupling circuit.

The first access transistor 111 inputs a first input signal INT and controls whether to output the first input signal INT according to a second input signal INB.

The second access transistor 112 inputs the second input signal INB and controls whether to output the second input signal INB according to the first input signal INT.

At this time, the potential levels of the first and second input signals INT and INB come to be opposite to each other. For example, if the potential level of the first input signal INT is High, that of the second input signal INB is Low. On the other hand, if the potential level of the first input signal INT is Low, that of the second input signal INB is High. And the potential level of each of those signals changes cyclically. The first and second input signals INT and INB are assumed to be, for example, differential signals (True/Bar). Actually, however, there are other more signals usable as such INT and INB signals.

The first inverter 113 inputs the output from the second access transistor 112 or from the second inverter 114, inverts the inputted signal, and outputs a first output signal OUTT. For example, if the first inverter 113 inputs the second input signal INB or the second output signal OUTB, the first inverter 113 outputs the first output signal OUTT, which is obtained by inverting the second input signal INB or the second output signal OUTB. At this time, the outputs from the first access transistor 111 and from the second inverter 114 flow together in the same wiring and the combined signal is inputted to the first inverter 113. The first output signal OUTT is output outside the subject test cell 11.

The second inverter 114 inputs the output from the first access transistor 111 or from the first inverter 113, inverts the inputted signal, and outputs a second output signal OUTB. For example, if the second inverter 114 inputs the first input signal INT or the first output signal OUTT, the second inverter 114 outputs the second output signal OUTB, which is obtained by inverting the first input signal INT or the first output signal OUTT. At this time, the outputs from the first inverter 113 and from the second access transistor 112 flow together in the same wiring and the combined signal is inputted to the second inverter 114. The second output signal OUTB is output outside the subject test cell 11.

In this first embodiment, it is assumed that an NMOS (n-channel MOS) transistor is employed as each of the first and second access transistors 111 and 112. In other words, the first access transistor 111 inputs the first input signal INT through its drain and the second input signal INB through its gate. The second access transistor 112 inputs the second input signal INB through its drain and the first input signal INT through its gate.

And it is also assumed in this first embodiment that an inverter (circuit) is employed as each of the first and second inverters 113 and 114. Usually, the inverter (circuit) consists of an N-channel transistor and a P-channel transistor. The N-channel transistor of the inverter (circuit) is referred to as a driver transistor. The P-channel transistor of the inverter (circuit) is referred to as a load transistor. The input side of the first inverter 113 is connected to the source of the second access transistor 112 and to the output side of the second inverter 114 respectively and the output side thereof is connected to the source of the first access transistor 111 and to the input side of the second inverter 114 respectively. The first inverter 113 outputs the first output signal OUTT. On the other hand, the input side of the second inverter 114 is connected to the source of the first access transistor 111 and to the output side of the first inverter 113 respectively and the output side thereof is connected to the source of the second access transistor 112 and to the input side of the first inverter 113 respectively. The first inverter 114 outputs the second output signal OUTB.

The PMOS (p-channel MOS) transistor may also be employed as each of the first and second access transistors 111 and 112. In this case, the drains and sources of the first and second access transistors 111 and 112 are exchanged in disposition and function.

Actually, however, the above examples are just examples; the present invention is not limited only to those examples.

If a plurality of test cells 11 are connected serially at this time, the first output signal OUTT is assumed as the first input signal INT of the next (succeeding) test cell 11. Similarly, the second output signal OUTB is assumed as the second input signal INB of the succeeding test cell 11.

If a plurality of test cells 11 are used to form a ring oscillator, the first output signal OUTT of the test cell 11 in the final step is assumed as the second input signal INB of the test cell 11 in the first (initial) step. Similarly, the second output signal OUTB of the test cell in the final step is assumed as the first input signal INT of the test cell in the first step. This means that two input signals are replaced with each other upon looping in the ring oscillator.

Next, there will be described an example of the configuration of the controller 20.

The controller 20 includes a first clock inverter 21, a second clock inverter 22, a first switch 23, a second switch 24, a first transfer gate 25, and a second transfer gate 26.

In this first embodiment, it is premised that nine test cells 11 are connected serially. The controller 20 controls inputs of the first and second input signals INT and INB with respect to each subject test cell. Here, if a plurality of test cells 11 are connected serially as described above, the controller 20 outputs the first and second input signals INT and INB to be inputted to the test cell 11 in the first step at first. The controller 20 then takes the first output signal OUTT of the test cell 11 in the final step as a new second input signal INB and the second output signal OUTB of the test cell 11 in the final step as a new first input signal INT and supplies those new signals to the test cell 11 in the first step.

Here, the controller 20 inputs/generates a clock signal φs, then generates a clock signal φs1, which is obtained by inverting the clock signal φs in the first clock inverter 21, then inputs/generates a clock signal φs2, which is obtained by inverting the clock signal φs1 in the second clock inverter 22. At this time, the controller 20 may include an oscillation circuit used to generate the clock signal φs or may receive the clock signal φs from external.

The controller 20 supplies the ground potential to the object test cell 11 as the first input signal INT through the first switch 23 that turns on in response to the clock signal φs1. Furthermore, the controller 20 supplies the power supply potential to the object test cell 11 as the first input signal INT through the second switch 24 that turns on in response to the clock signal φs2. This means that the first switch 23 that is grounded turns on in response to the clock signal φs1 and at this time the ground potential is supplied to the object test cell 11 as the first input signal INT. The second switch 24 connected to the power supply is turned on in response to the clock signal φs2 and at this time the power supply potential is supplied to the object test cell 11 as the second input signal INB. The first and second switches 23 and 24 are turned on simultaneously.

The first switch 23 consists of an n-MOS transistor, in which the drain is grounded, the gate receives the clock signal φs1, and the source supplies the first input signal INT to the object test cell 11. The second switch 24 consists of a PMOS transistor, in which the source is connected to the power supply, the gate receives the clock signal φs2, and the drain supplies the second input signal INB to the object test cell 11. Actually, however, the above examples are just examples; the present invention is not limited only to those examples.

The controller 20 supplies the second output signal OUTB of the test cell 11 in the final step to the test cell 11 in the first step as the first input signal INT through the first transfer gate 25. Furthermore, the controller 20 also supplies the first output signal OUTT of the test cell 11 in the final step to the test cell 11 in the first step as the second input signal INB through the second transfer gate 26. A buffer 27 connected to the test cell 11 in the final step inputs the first output signal OUTT of the test cell 11 in the final step and outputs an output signal OUT.

Here, the first and second transfer gates 25 and 26 are formed with a PMOS transistor of which gate inputs the clock signal φs1 and an NMOS transistor of which gate inputs the clock signal φs2. The output of the first transfer gate 25 is combined with the output of the first switch 23, then the combined signal is inputted to the test cell 11 in the first step. Similarly, the output of the second transfer gate 26 is combined with the output of the second switch 24, then the combined signal is inputted to the test cell 11 in the first step.

Usually, a ring oscillator is composed of odd-numbered inverters. According to the present invention, however, the ring oscillator can be composed of even-numbered cells, since the output of the cell in the final step is inputted to the cell in the first cell whether those cells are odd-numbered or even-numbered ones. In other words, the ring oscillator of the present invention can be formed with any of odd-numbered and even-numbered test cells 11.

Figure 4:
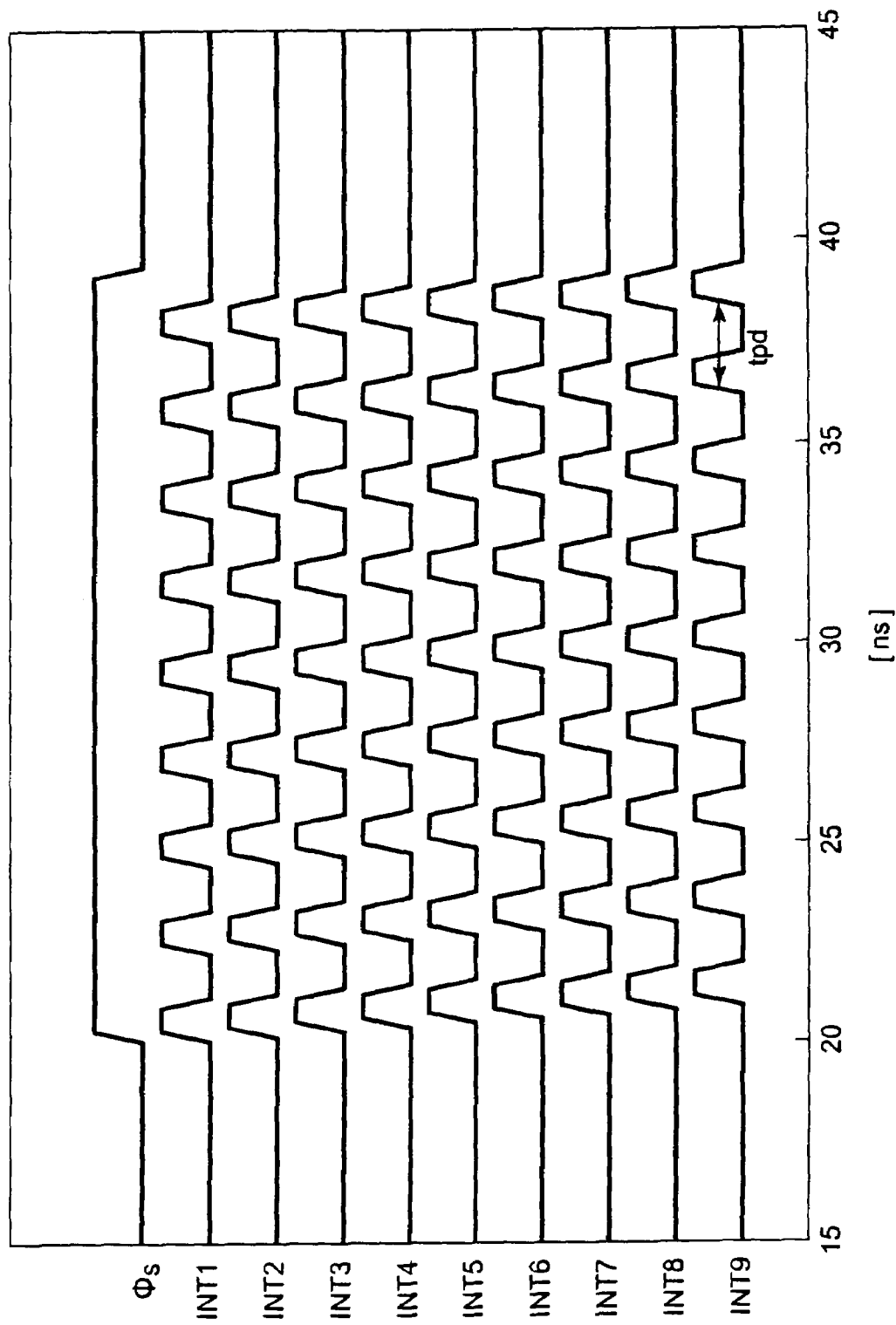
FIG. 4 is an operation waveform diagram of the ring oscillator.

Next, there will be described a mechanism that generates a propagation delay time with reference to FIG. 4.

Here, it is premised that nine test cells 11 are connected serially. An external test device (not shown) is used to monitor the clock signal φs and the first input signal INT of each test cell 11. The first input signal INT1 of the test cell 11 in the first step is activated in response to the activation of the clock signal φs. Hereinafter, the first input signal INT1 is activated for the subsequent test cells (second to ninth cells) sequentially, but the activation of each of the first input signals INT1 to INT9 in each test cell comes to be shifted up little by little. And the deactivation of each of those first input signals INT1 to INT9 is shifted down little by little. At this time, in response to the deactivation of the clock signal φs, the first input signal INT1 of the test cell 11 in the final step (the ninth cell) is deactivated. The time between the first activation and the next activation of a predetermined first input signal INT is defined as a propagation delay time tpd (time of propagation delay).

The propagation delay time tpd can be measured as follows, for example. In case of the semiconductor device of the present invention, a tpd determination circuit is provided in the macro or a probe is applied to the wafer that includes the semiconductor device of the present invention for measurement. Actually, however, the examples are just examples; the present invention is not limited only to those examples.

Figure 5A:
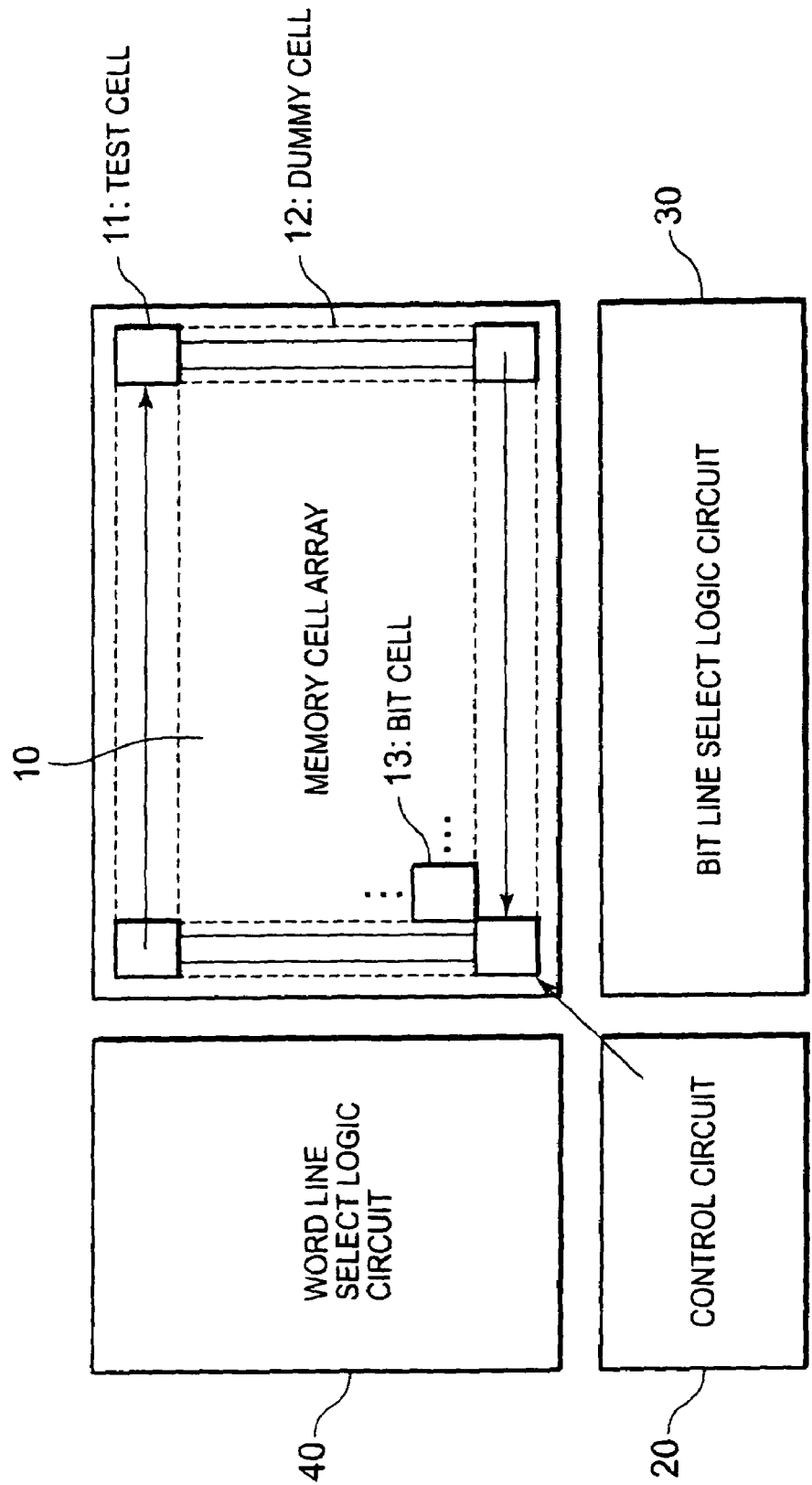
FIG. 5A is a block diagram of a semiconductor device in a configuration employed in a first embodiment of the present invention.

Next, there will be described a concrete example of the configuration of the semiconductor device in this first embodiment with reference to FIGS. 5A and 5B.

The memory cell array 10 includes test cells 11, dummy cells 12, and a bit cell 13.

The test cells 11 (11-ii, I=1 to x; x=any number) are disposed at both ends of a bit line provided on the memory cell array 10. In this embodiment, the test cells 11 are disposed at inside corners of the rectangular memory cell array 10 respectively.

A dummy cell (12-j, j=1 to y: y=any number) is disposed between each pair of the test cells 11 disposed at the inside corners of the memory cell array 10. The test cells 11 and the dummy cells 12 are combined to form a ring oscillator.

Each bit cell 13 (13-k, k=1 to z: z=any number) is a circuit required to hold single bit information. The bit cells 13 are disposed at intersecting points of each bit line and each word line formed on the memory cell array 10 respectively.

At this time, the test cells 11 disposed at the inside corners of the memory cell array 10 are connected to each another through the bit line (replica bit line) of the corresponding dummy cell 12. In other words, inside the memory cell array 10, a ring oscillator formed by the memory cell array 10 and the dummy cells 12 is disposed along the outer periphery and the bit cells 13 are disposed in the area inside the ring oscillator. Here, the replica bit line among the wired bit lines denotes a wiring not connected to any of the bit selectors 30 and the bit cells 13. In other words, the replica line is an inactive wired bit line.

Figure 6A:
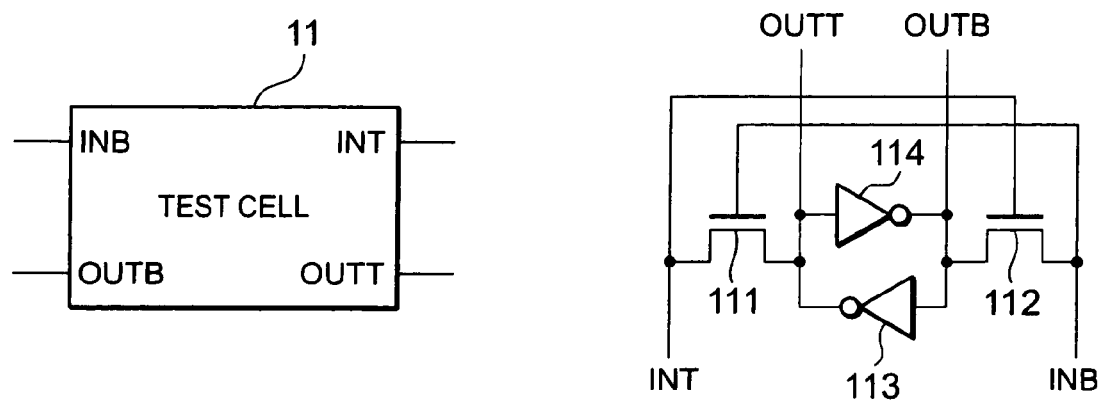
FIG. 6A is a circuit diagram of a test cell in a configuration.

Next, there will be described an example of the configuration of the test cell 11 with reference to FIGS. 6A and 6B.

Figure 2:
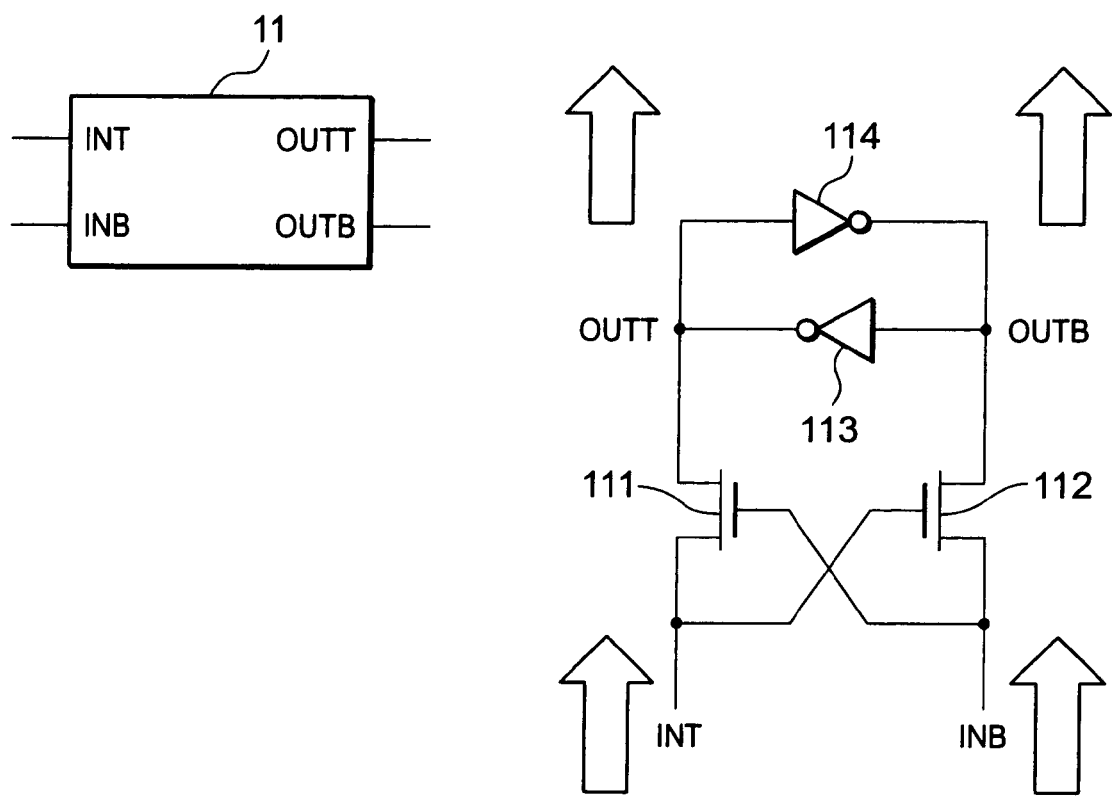
FIG. 2 is a circuit diagram of a test cell in a basic configuration.

Basically, each test cell 11 is configured as shown in FIG. 2. In FIGS. 6A and 6B, the test cells 11 are shown in a circuit diagram so as to correspond to the circuit diagram shown in FIG. 5B. In FIG. 6A, each test cell 11 outputs the first and second output signals OUTT and OUTB as are. In FIG. 6B, each test cell 11 inverts the first and second output signals OUTT and OUTB and outputs the inverted signals.

Figure 6B:
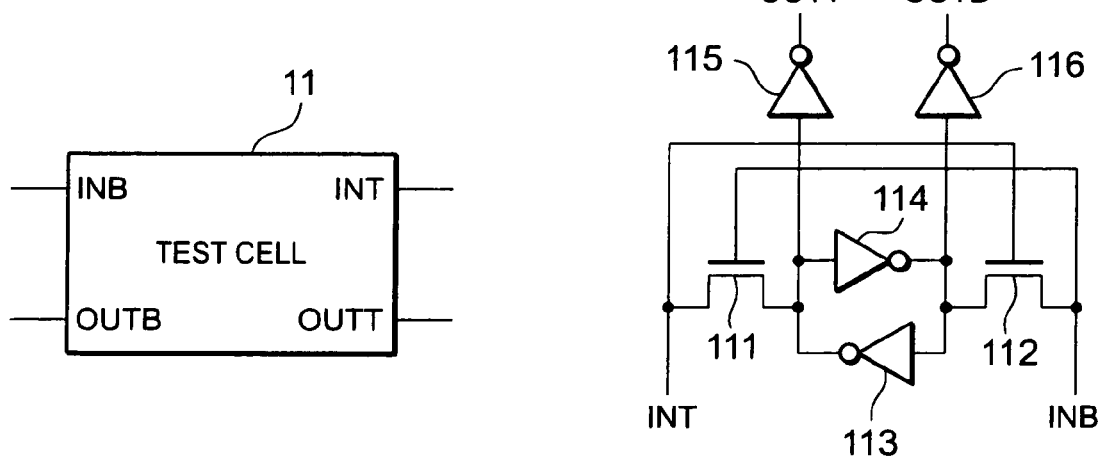
FIG. 6B is a concrete circuit diagram of the test cell in the configuration shown in FIG. 6A.
Figure 7:
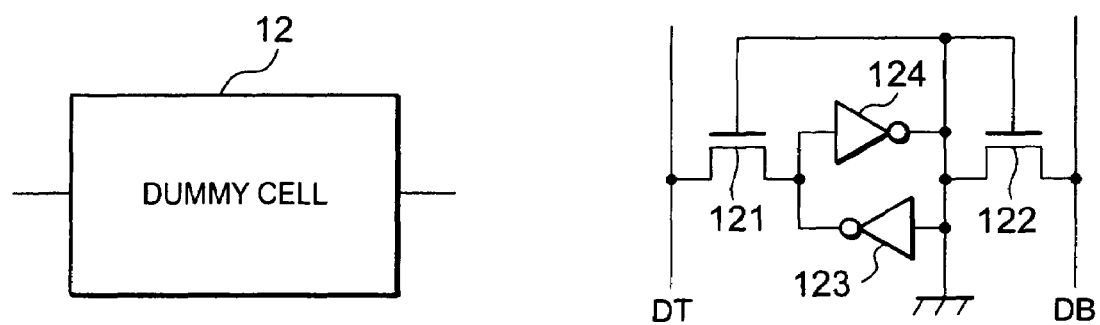
FIG. 7 is a circuit diagram of a dummy cell in a configuration.
Figure 8:
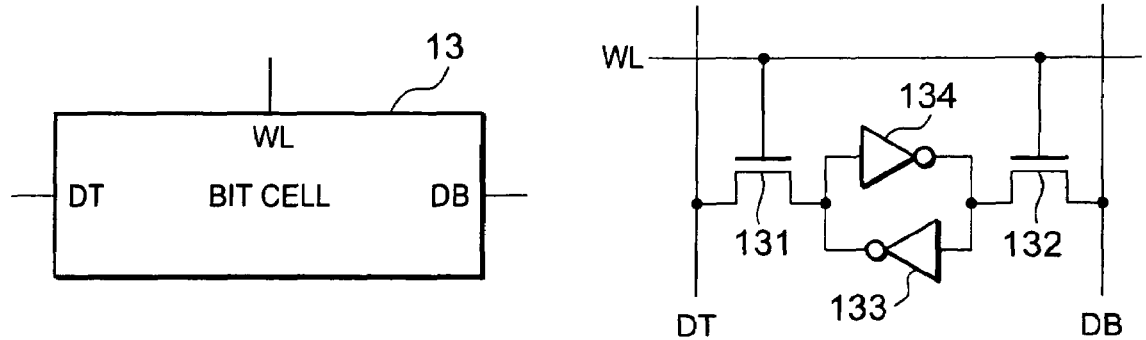
FIG. 8 is a circuit diagram of a bit cell in a configuration.

In FIG. 6B, each test cell 11 includes a first access transistor 111, a second access transistor 112, a first inverter 113, a second inverter 114, a first output inverter 115, and a second output inverter 116. Those transistors and inverters are the same as those shown in FIG. 2. The dimensions of each of the first and second output inverters 115 and 116 has the same as that of the write circuit. The first output inverter 115 inverts the first output signal OUTT and outputs the inverted signal. The second output inverter 116 inverts the second output signal OUTB and outputs the inverted signal. Here, the first and second output inverters 115 and 116 should preferably be formed with transistors having almost the same gate length L and gate width was those of the transistors of the write circuit. The first and second output inverters 115 and 116 should preferably be on the same process conditions as those of the transistors of the write circuit with respect to the well dose injection amount, the dose energy amount, etc.

Next, there will be described an example of the configuration of the dummy cell 12.

Each dummy cell 12 includes a first dummy cell transistor 121, a second dummy cell transistor 122, a first dummy cell inverter 123, and a second dummy cell inverter 124. Here, it is premised that an NMOS transistor is employed as each of the first and second dummy cell transistors 121 and 122. The first dummy cell transistor 121 is connected to the first bit line that transmits the first drive signal DT. The first drive signal DT may be replaced with the first output signal OUTT of the test cell 11. The second dummy cell transistor 122 is connected to the second bit line that transmits the second drive signal DB. The second drive signal DB may be replaced with the second output signal OUTB of the test cell 11. Each of the first and second bit lines, when not connected to any of the bit selector 30 and the bit cell 13, functions as a replica bit line. The first dummy cell inverter 123 inverts the output of the second dummy cell transistor 122 and outputs the inverted signal to the second dummy cell inverter 124. The second dummy cell inverter 124 inverts the output of the first dummy cell transistor 121 or the first dummy cell inverter 123 and outputs the inverted signal to the gates of the first dummy cell transistor 121 and the second dummy cell transistor 122 respectively.

Next, there will be described an example of the configuration of the bit cell 13.

Each bit cell 13 includes a first bit cell transistor 131, a second bit cell transistor 132, a first bit cell inverter 133, and a second bit cell inverter 134. Here, it is premised that an NMOS transistor is employed as each of those transistors and inverters. The first bit cell transistor 131 inputs the first drive signal DT through the first bit line. The second bit cell transistor 132 inputs the second drive signal DB through the second bit line. The gates of the first and second bit cell transistors 131 and 132 are connected to word lines and driven in response to a word line control signal WT received from the word selector 40 respectively. The first bit cell inverter 133 inverts the output from the second bit cell transistor 132 and outputs the inverted signal to the second bit cell inverter 134. The second bit cell inverter 134 inverts the output from the first bit cell transistor 131 and outputs the inverted signal to the first bit cell inverter 133. The first and second bit cell inverters 133 and 134 are combined to form a latch circuit, which holds data temporarily.

As described above, each of the test cells 11 to 13 consists of six transistors, but how those transistors are connected to each another differs among those types of cells 11 to 13. Consequently, the wiring connection can be set differently among those cells that are equivalent to the dummy cells 12 and the bit cells 13, thereby enabling those cells to function as test cells 11.

Hereunder, there will be described the second embodiment of the present invention.

In this second embodiment, ring oscillators provided in a plurality of memory cell arrays are connected to each another.

Figure 9B:
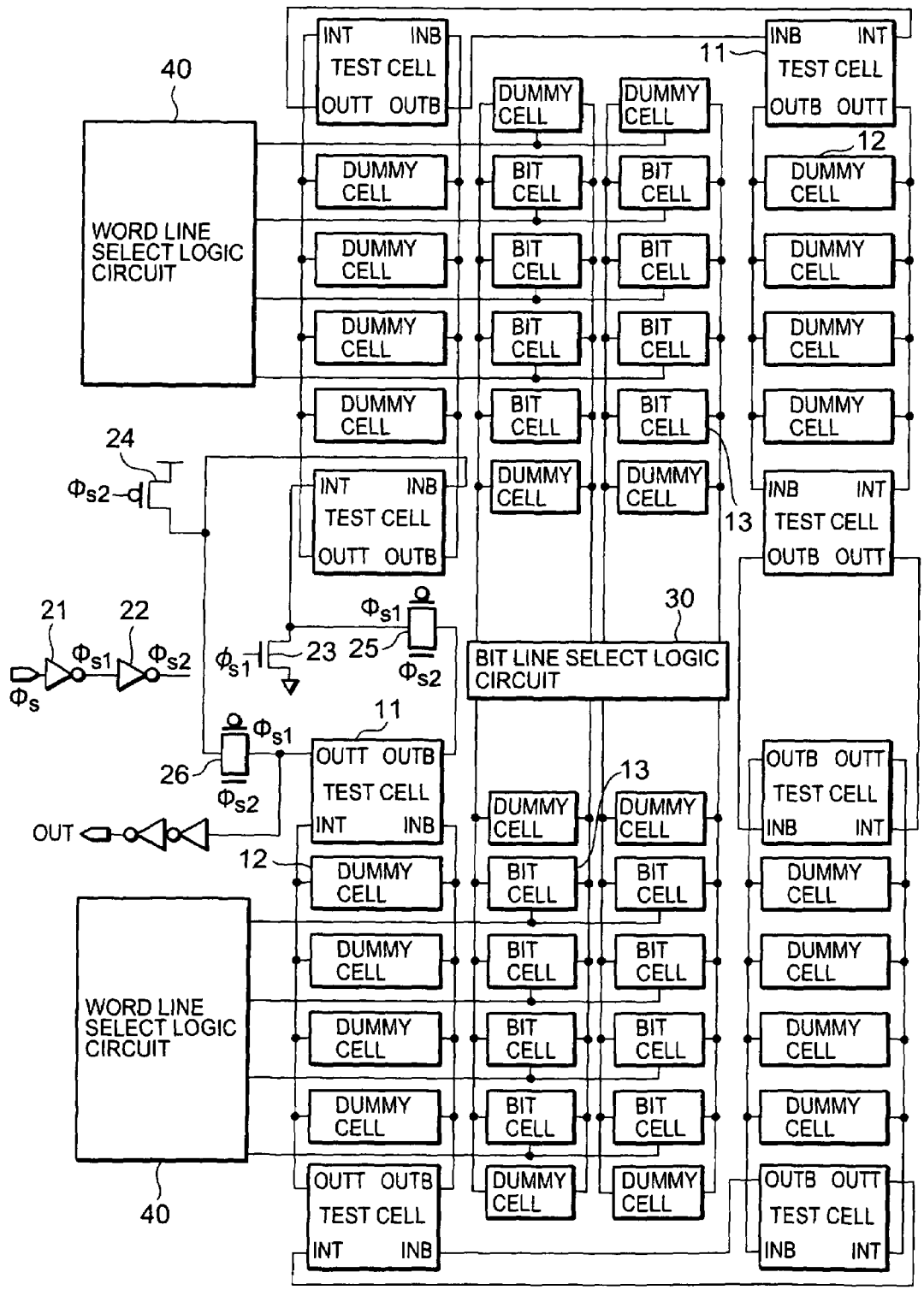
FIG. 9B is a concrete detailed block diagram of the semiconductor device in the configuration employed in the second embodiment of the present invention.

As shown in FIGS. 9A and 9B, the semiconductor device in this second embodiment includes two memory cell arrays 10, a control circuit 20, a bit line select logic circuit 30, and a word line select logic circuit 40.

The memory cell array 10, the control circuit 20, the bit line select logic circuit, and the word line select logic circuit 40 are basically the same in circuit configuration as those in the first embodiment.

As described above, there are two memory arrays 10, which are connected to each other in this second embodiment. Here, the test cells 11 provided on one memory cell array 10 are connected to the test cells provided on the other memory cell array 10 respectively.

Although the two memory cell arrays 10 are connected to each other in this example, three or more memory cell arrays 10 can be connected to each another actually. In this case, a bit line select logic circuit 30 is disposed between each pair of memory cell arrays 10. And the number of control circuits 20 becomes the same as that of bit line select logic circuits 30. The number of word line select logic circuits 40 also becomes the same as the number of memory cell arrays 10. In case of the semiconductor device in this second embodiment, a plurality of circuits connected in such a way can be disposed consecutively.

Next, there will be described the third embodiment of the present invention with reference to FIGS. 10A through 10C.

In this third embodiment, the test cells 11 are disposed in a line at each end of each memory cell array 10 and at the inner side of the line of the disposed test cells 11 are disposed a plurality of test selectors having the same type as that of Y selectors in a line.

Figure 10B:
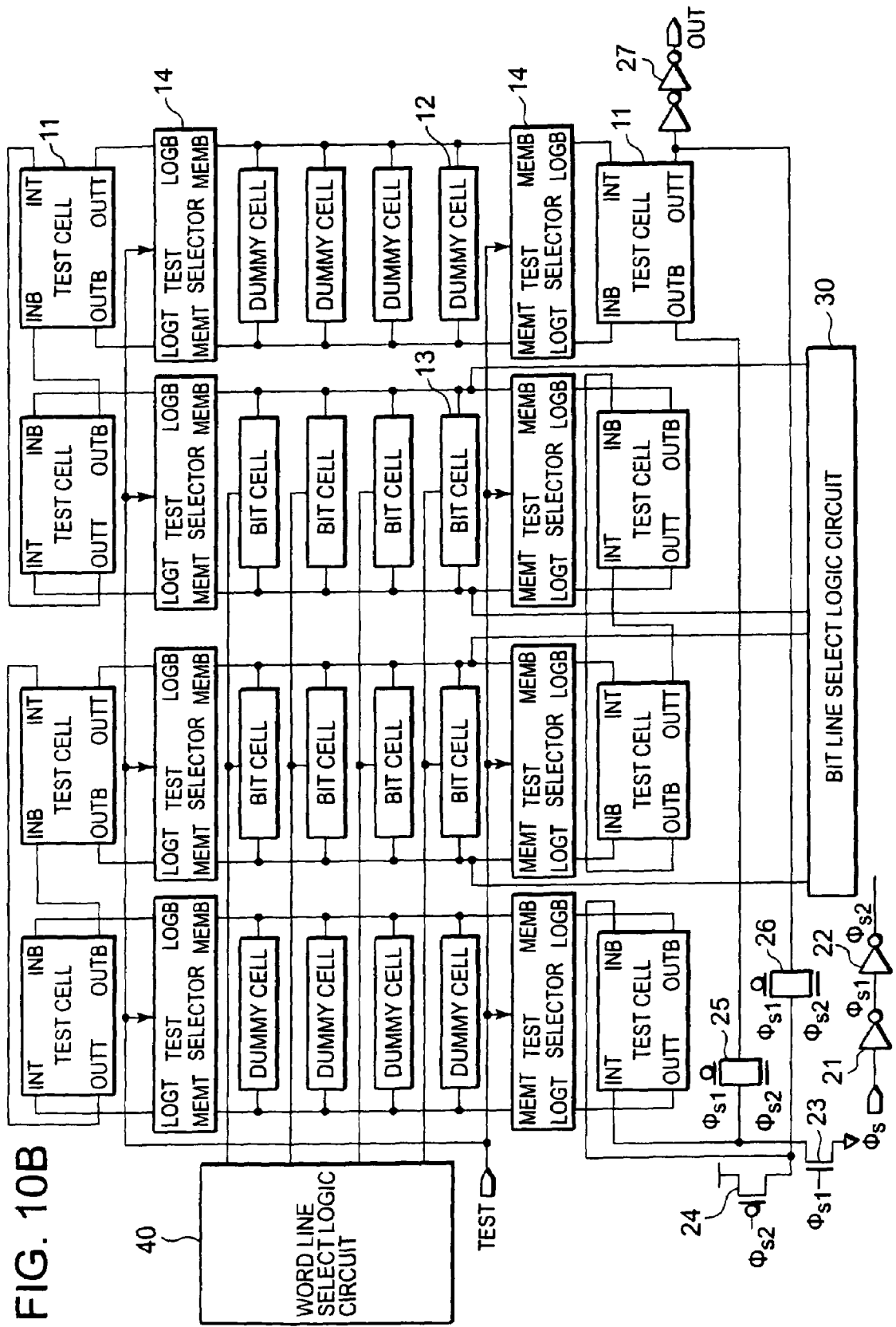
FIG. 10B is a concrete detailed block diagram of the semiconductor device in the configuration employed in the third embodiment of the present invention.
Figure 10C:
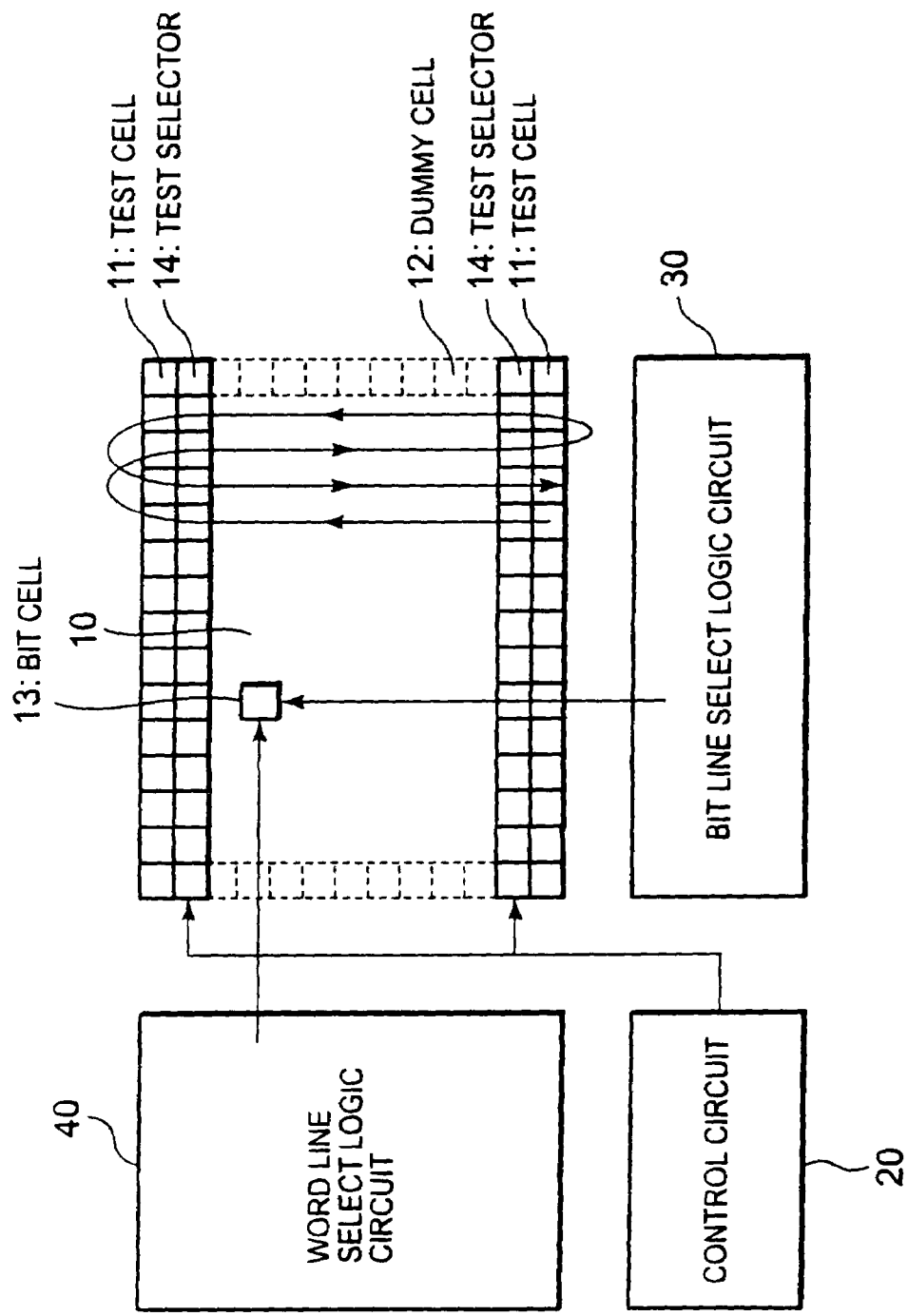
FIG. 10C is a second block diagram of the semiconductor device in the configuration employed in the third embodiment of the present invention.
Figure 11:
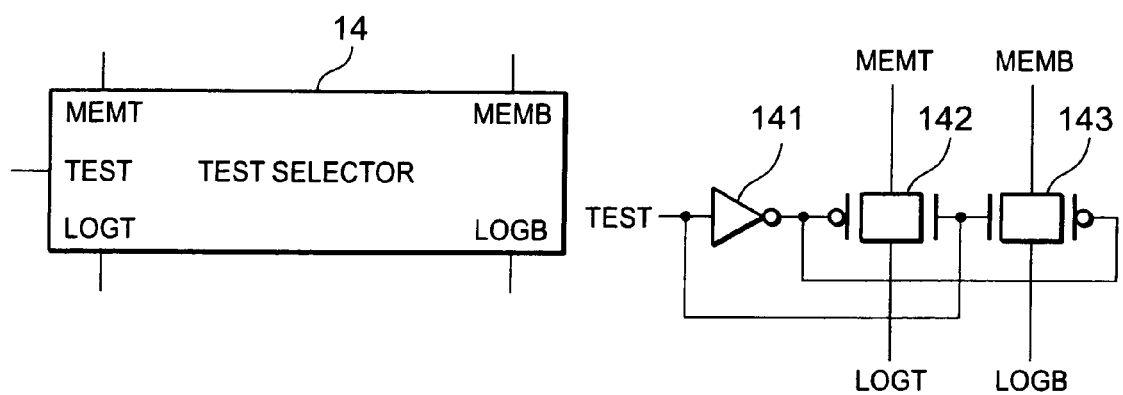
FIG. 11 is a circuit diagram of a test selector in a configuration.

As shown in FIGS. 10A through 10C, the semiconductor device in this third embodiment includes a memory cell array 10, a control circuit 20, a bit line select logic circuit 30, and a word line select logic circuit 40.

The control circuit 20, the bit line select logic circuit 30, and the word line select logic circuit 40 are basically the same in circuit configuration as those of the semiconductor device in the first embodiment.

The memory cell array 10 includes a plurality of test cells 11, a plurality of dummy cells 12, a plurality of bit cells 13, and a plurality of test selectors 14.

The test cells 11, the dummy cells 12, the bit cells 13, and the test selectors 14 are basically the same in circuit configuration as those of the semiconductor device in the first embodiment.

Each test selector 14 is disposed between each pair of test cells 11 connected to each another through a bit line. The test selector 14 controls whether to pass the output of each test cell 11 in response to a test control signal TEST received from external. In this embodiment, the test cells 11 are disposed in a line at each end of the memory cell array 10 and the test selectors 14 are disposed in a line at the inner side of the line of the test cells 11 disposed in such a way. The test selectors 14 are basically the same in circuit configuration as the Y selectors. In this third embodiment, each test selector 14 inputs the first output signal OUTT from each test cell 11 as a first log input signal LOGT in response to a test control signal TEST received from external and outputs a first memory control signal MEMT. At the same time, the test selector 14 inputs the second output signal OUTB from each test cell 11 as a second log input signal LOGB and outputs a second memory control signal MEMB. In this third embodiment, the control circuit 20 outputs the test control signal TEST to the corresponding test selector 14.

In the semiconductor device in this third embodiment, the potential level of the test control signal TEST is high during test operation. At this time, the bit line select logic circuit 30 and the word line select logic circuit 40 are disabled to select any SRAM cells. While the SRAM is active, the potential level of the test control signal TEST is Low.

Here, the bit line select logic circuit 30 may be replaced with a data bus RWB (Read/Write data Bus). Although not shown here, an ordinary data bus RWB includes a sense amplifier and a Y selector. The sense amplifier is equivalent to the test cell 11. The Y selector is equivalent to the test selector 14. In other words, while no test operation is active and the bit line select logic circuit 30 is enabled to select SRAM cells, the sense amplifier can operate instead of the test cell 11 and the Y selector can operate instead of the test selector 14.

A test cell chain in the memory cell array 10 in this third embodiment may be formed so as to couple adjacent columns to each other and furthermore, it may be formed so as to couple those columns alternately and make a U-turn upon reaching the other side cell array as shown in FIG. 10C. For example, the odd-numbered columns are coupled to each another and when the chain reaches the other side cell array, the even-numbered columns are coupled to each another. Actually, however, two or more columns may be skipped to be coupled to each other.

Next, there will be described an example of the configuration of the test selector 14.

The test selector 14 includes a TS (test selector) inverter 141, a first TS transfer gate 142, and a second TS transfer gate 143. The TS inverter 141 inverts the test control signal TEST and outputs the inverted signal. The first TS transfer gate 142 inputs the first log input signal LOGT and controls whether to output a first memory control signal MEMT in response to both of the output from the TS inverter 141 and the test control signal TEST. In this third embodiment, the first TS transfer gate 142 consists of a PMOS transistor and an NMOS transistor and inputs the output from the TS inverter 141 through the gate of the PMOS transistor and the test control signal TEST through the gate of the NMOS transistor. The second TS transfer gate 143 also consists of a PMOS transistor and an NMOS transistor and inputs a second log input signal LOGB and controls whether to output a second memory control signal MEMB in response to both of the output from the TS inverter 141 and the test control signal TEST. In this third embodiment, the second TS transfer gate 143 that consists of a PMOS transistor and an NMOS transistor as described above inputs the output from the TS inverter 141 through the gate of the PMOS transistor and the test control signal TEST through the gate of the NMOS transistor.

As described above, according to the present invention, cells are disposed at both ends of a cell array to form an inversion circuit required to form a ring oscillator so as to monitor how the parasitic resistance and capacity are to be varied by processes and to enable the ring oscillator to operate while charging/discharging bit lines.

Figure 3:
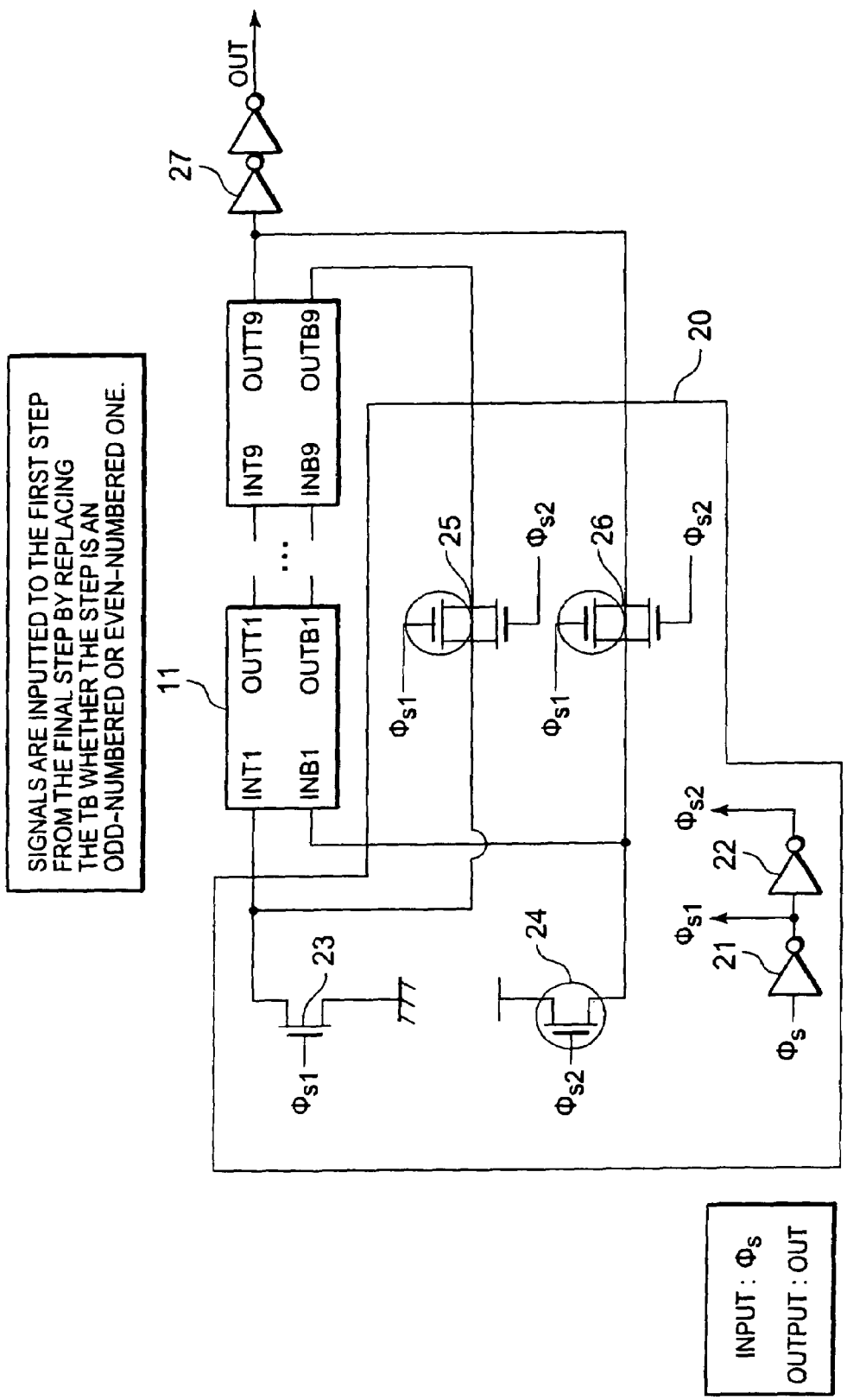
FIG. 3 is a circuit diagram of a ring oscillator in a configuration.

As shown in FIG. 1, the semiconductor device of the present invention includes an SRAM cell array, a word line select logic circuit and a bit line select logic circuit required to drive the SRAM memory cell array, and a control circuit. The cells shown in FIG. 2 are disposed to form a ring oscillator as shown in FIG. 3. Those cells are disposed in the SRAM cell array and the cells shown in FIG. 2 are connected to each another serially through bit lines. FIG. 4 shows an operation waveform of the SRAM ring oscillator shown in FIG. 3. The ring oscillator monitors the tpd (time of propagation delay) shown in FIG. 4. When in a chip monitoring process, at first, the chip is set in the monitoring circuit or the output of the ring oscillator is led outside the chip and measured by an external device.

According to the present invention, because SRAM cell transistors and their wirings are used to form a ring oscillator, evaluations can be made easily for the transistor performance and the systematic fluctuation of the wiring capacity/resistance.

While the preferred forms of the present invention have been described, it is to be understood that modifications will be apparent to those skilled in the art without departing from the spirit of the invention.

What is claimed is:

1. A semiconductor device comprising:
an SRAM cell array;
a ring oscillator formed with a plurality of cells provided on the SRAM cell array,
wherein the cells used to form the ring oscillator are connected to each another through a bit line wiring provided on the SRAM cell array;
wherein the ring oscillator includes a plurality of test cells consisting of six transistors respectively that are different from those of each bit cell,
wherein among the plurality of test cells, those disposed on the same bit line wiring of the SRAM cell array are connected to each another through the same bit line wiring;
wherein each of the test cells includes:
a first access transistor that inputs a first input signal and controls whether to output the first input signal according to a second input signal;
a second access transistor that inputs the second input signal and controls whether to output the second input signal according to the first input signal;
a first inverter that inputs an output of the second access transistor, inverts the inputted signal, and outputs a first output signal;
a second inverter that inputs an output of the first access transistor or the first output signal, inverts the inputted signal, and outputs a second output signal to be inputted to the first inverter;
wherein the plurality of test cells are disposed serially, and
wherein among the serially disposed test cells, the test cell in the first step replaces the output of the test cell in the final step so as to input the first output signal as the second input signal and the second output signal as the first input signal respectively.

2. The semiconductor device according to claim 1, wherein the plurality of test cells includes:
a first cell; and
a second cell connected to the first cell through a first bit line wiring and a second bit line wiring of the SRAM cell array,
wherein the first output signal output from the first cell is inputted to the first access transistor of the second cell through the first bit line wiring of the SRAM cell array, and
wherein the second output signal output from the first cell is inputted to the second access transistor of the second cell through the second bit line wiring of the SRAM cell array.

3. The semiconductor device according to claim 1, wherein the ring oscillator comprises the test cells disposed in even-numbered steps.

4. The semiconductor device according to claim 1, further comprising:
a plurality of dummy cells, each being disposed between each pair of the plurality of test cells,
wherein each of the plurality of test cells is disposed at a corner of the shape of the SRAM cell array and connected to others through a replica bit line of the corresponding dummy cell.

5. The semiconductor device according to claim 1, further comprising:
a plurality of test selectors, each being provided between each pair of the plurality of test cells and used to control whether to pass the output of the corresponding test cell according to a test control signal received from external.

6. A semiconductor device designing method, comprising:
forming a ring oscillator with a plurality of cells provided on an SRAM cell array; and
connecting each cell to another in the ring oscillator through a bit line wiring provided on the SRAM cell array;
providing a plurality of test cells, each consisting of six transistors that are different from those of each bit cell, so as to form the ring oscillator; and
connecting the test cells selected from among the plurality of test cells and disposed on the same bit line wiring of the SRAM cell array to each another through the same bit line wiring;
providing a first access transistor that inputs a first input signal and controls whether to output the first input signal according to a second input signal;
providing a second access transistor that inputs the second input signal and controls whether to output the second input signal according to the first input signal;
providing a first inverter that inputs an output of the second access transistor, inverts the inputted signal, and outputs a first output signal;

providing a second inverter that inputs an output of the first access transistor or the first output signal, inverts the inputted signal, and outputs a second output signal to be inputted to the first inverter;

forming each of the plurality of test cells by combining the first access transistor, the second access transistor, the first inverter, and the second inverter;

disposing the plurality of test cells serially; and enabling the test cell in the first step among the serially disposed test cells to replace the output of the test cell in the last step so as to input the first output signal as the second input signal and the second output signal as the first input signal.

7. The semiconductor device designing method according to claim 6, further comprising:

connecting the first and second cells among the plurality of test cells to each other through the first and second bit line wirings of the SRAM cell array;

connecting the first and second cells so that the first output signal of the first cell is inputted to the first access transistor of the second cell through the first bit line wiring of the SRAM cell array; and connecting the first and second cells so that the second output signal of the first cell is inputted to the second access transistor of the second cell through the second bit line wiring of the SRAM cell array.

8. The semiconductor device designing method according to claim 6, further comprising:

forming the ring oscillator with the test cells in the even-numbered steps.

9. The semiconductor device designing method according to claim 6, further comprising:

disposing each of the plurality of test cells at a corner of the shape of the SRAM cell array;

disposing a dummy cell between each pair of the plurality of test cells; and connecting each of the plurality of test cells to others through a replica bit line of the corresponding dummy cell.

10. The semiconductor device designing method according to claim 6, further comprising:

providing a plurality of test selectors, each being disposed between each pair of the plurality of test cells so as to control whether to pass an output of each of the test cells according to a test control signal received from external.

* * * * *